(12) United States Patent
Pahl

(10) Patent No.: US 9,854,350 B2
(45) Date of Patent: Dec. 26, 2017

(54) MICROPHONE HAVING INCREASED REAR VOLUME, AND METHOD FOR PRODUCTION THEREOF

(71) Applicant: Epcos AG, München (DE)

(72) Inventor: Wolfgang Pahl, München (DE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/126,863

(22) PCT Filed: Feb. 18, 2015

(86) PCT No.: PCT/EP2015/053404
§ 371 (c)(1),
(2) Date: Sep. 16, 2016

(87) PCT Pub. No.: WO2015/161940
PCT Pub. Date: Oct. 29, 2015

(65) Prior Publication Data
US 2017/0094402 A1 Mar. 30, 2017

(30) Foreign Application Priority Data
Apr. 25, 2014 (DE) .................. 10 2014 105 849

(51) Int. Cl.
*H04R 1/22* (2006.01)
*H04R 31/00* (2006.01)
(Continued)

(52) U.S. Cl.
CPC ........... *H04R 1/222* (2013.01); *B81B 7/0061* (2013.01); *B81C 1/00309* (2013.01); *H04R 1/04* (2013.01);
(Continued)

(58) Field of Classification Search
CPC ... H01L 2924/1461; H01L 2224/48137; B81B 2201/0257; B81B 2207/012; H04R 19/04;
(Continued)

(56) References Cited

U.S. PATENT DOCUMENTS

| 2010/0080405 A1 | 4/2010 | Wu |
| 2012/0008805 A1* | 1/2012 | Hachinohe ............ B81B 7/0064 381/163 |
| 2013/0136291 A1* | 5/2013 | Lee ...................... H04R 19/005 381/355 |
| 2013/0140656 A1 | 6/2013 | Pahl |

(Continued)

FOREIGN PATENT DOCUMENTS

| CN | 203482390 U | 3/2014 |
| DE | 102004011148 B3 | 11/2005 |

(Continued)

*Primary Examiner* — Matthew Eason
(74) *Attorney, Agent, or Firm* — Nixon Peabody LLP

(57) ABSTRACT

For a microphone having an increased rear volume, a cavity housing is proposed, comprising at least a base plate and a covering, which define and enclose the cavity. On the base plate, a microphone transducer, usually an MEMS component, is mounted alongside a sound guiding element. The microphone transducer and the sound guiding element are sealed off with respect to the base plate by a partition and separate the front volume from a rear volume under the covering. The sound guiding element provides a sound channel, which connects an opening in the covering to the front volume. The sound guiding element finishes right up against the covering and thus seals off the sound channel with respect to the rear volume.

20 Claims, 2 Drawing Sheets

Figure 1:
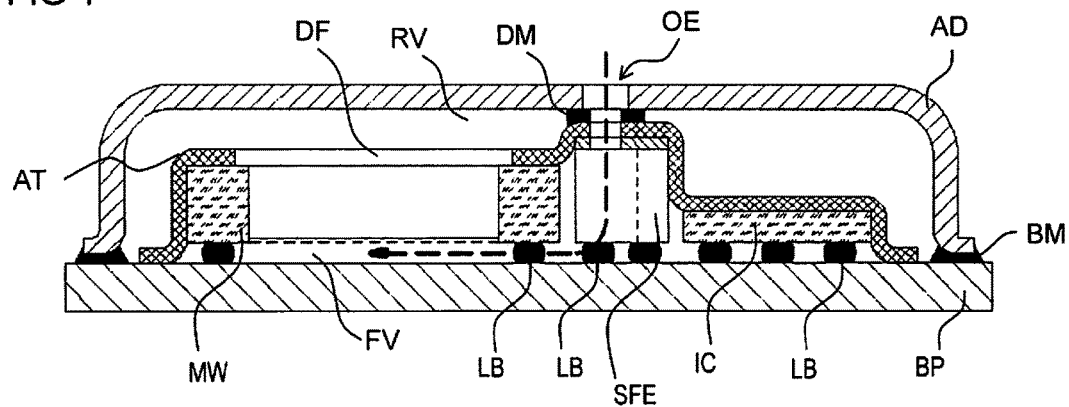

(51) Int. Cl.
*H04R 1/04* (2006.01)
*H04R 19/04* (2006.01)
*B81B 7/00* (2006.01)
*B81C 1/00* (2006.01)

(52) U.S. Cl.
CPC ............ *H04R 19/04* (2013.01); *H04R 31/006* (2013.01); *B81B 2201/0257* (2013.01); *B81B 2203/0127* (2013.01); *B81B 2207/015* (2013.01); *H04R 2201/003* (2013.01)

(58) Field of Classification Search
CPC ............ H04R 19/005; H04R 2201/003; B81C 1/00261; B81C 1/00825
See application file for complete search history.

(56) References Cited

U.S. PATENT DOCUMENTS

| | | |
|---|---|---|
| 2013/0241045 A1 | 9/2013 | Goida |
| 2014/0064546 A1 | 3/2014 | Szczech |

FOREIGN PATENT DOCUMENTS

| | | |
|---|---|---|
| DE | 102005008512 A1 | 8/2006 |
| DE | 102005053765 A1 | 5/2007 |
| DE | 102011012295 A1 | 8/2012 |
| EP | 2381698 A1 | 10/2011 |
| EP | 2191500 B1 | 11/2013 |
| JP | 2011-124748 A | 6/2011 |
| JP | 2013-085198 A | 5/2013 |
| KR | 10-1369464 B1 | 3/2014 |
| WO | WO 2012/004339 A1 | 1/2012 |
| WO | WO 2014/202283 A2 | 12/2014 |

\* cited by examiner

MICROPHONE HAVING INCREASED REAR VOLUME, AND METHOD FOR PRODUCTION THEREOF

CROSS-REFERENCE TO RELATED APPLICATIONS

This application is a U.S. National Stage of International Application No. PCT/EP2015/053404, filed on Feb. 18, 2015, which claims the benefit of Germany Patent Application No. 10 2014 105 849.6, filed on Apr. 25, 2014, both of which are incorporated herein by reference in their entireties.

A so-called bottom port microphone has a housing, in which a sound entry opening is arranged on the underside, that is to say where external electrical connections of the component are also located. Consequently, the internal components (MEMS, ASIC) can also be arranged at the bottom of the housing, therefore generally on a carrier substrate, which leads to a very simple construction. A printed circuit board or a multilayer substrate, in each case with integrated wiring and interconnection, may then serve as a carrier substrate.

In the case of a top port microphone, on the other hand, the sound entry opening lies on a surface facing away from the external connections, in particular the upper side of the microphone. To use an acoustic rear volume that is as large as possible, the MEMS chip (and possibly the ASIC) may then likewise be arranged in the region of the sound entry, but then a rerouting of the electrical wiring from there to the underside of the housing must be performed, which is technologically complex and critical for the performance of the component.

An alternative is to leave the internal components on the carrier substrate and instead divert the incoming sound in a suitable way through a gap between components on the carrier substrate, as known for example from DE 10 2011 012295 A1. There, the MEMS chip is sealed off with respect to the carrier substrate by a film covering, which at the same time also covers and encloses the existing rear volume. However, this concept does not allow the rear volume that is already existing in the MEMS chip to be increased.

The method is also critical with respect to the geometry of the gap, which may lead to disadvantageous noise and resonance. In addition, the positioning of the sound entry on the upper side of the housing is subject to restrictions.

EP 2 191 500 B1 discloses a component that avoids these disadvantages, but in return requires an extremely complex housing with internal sound diversion, which is accompanied by high production costs and limited suitability for miniaturization.

It is known from DE 10 2004 011148 B3 to secure the MEMS chip between the carrier substrate and a covering in the form of a cap. As a result, neither electrical signals nor acoustic signals have to be diverted, but here the extremely stress-sensitive chip is disadvantageously clamped rigidly between housing parts and is therefore subject to their dimensional tolerances and thermomechanical movements. A further disadvantage is that here the MEMS-internal volume is lost to the front volume.

An object of the present invention is therefore to provide a microphone having a sound entry opening arranged at the top that avoids the disadvantages stated at the beginning. In particular, an object of the invention is to avoid disadvantageous thermomechanical stress for the MEMS chip and nevertheless to make an increased rear volume available.

Furthermore, the housing should be of a technologically simple design, so that it can be produced at low cost.

This object is achieved according to the invention by a microphone with the features of claim 1. Advantageous refinements of the invention and a method for producing the microphone can be taken from further claims.

The microphone has a closed, particularly rigid cavity housing, which has at least a base plate, a covering and an opening therein for the sound entry. A microphone transducer, formed as an MEMS component, and a sound guiding element with a sound channel formed therein are arranged and mounted alongside one another on the base plate within the cavity housing. Further components may be mounted inside, in particular an ASIC with an integrated circuit for controlling the microphone function. Also provided inside the cavity is a partition, which divides the cavity into a front volume and a rear volume. The sound channel connects the opening in the covering to the front volume and is closed off in a soundproof manner with respect to the rear volume.

The cavity housing may be produced by various technologies that are known per se. What is important is that a cavity is preformed in the housing. This is possible for example by the microphone that is mounted on a flat base plate being covered with a covering in the form of a cap, so that it is arranged in a cavity. It is also possible to place on the flat base plate a wall element, which laterally encloses the later cavity, and also to cover this cavity subsequently with a cover. It is also possible to provide a base plate having a well-shaped depression or simply to provide a well-shaped base part, in which the components of the microphone can be mounted. Accordingly, the materials that are used for the housing may also differ.

Any desired MEMS component known per se may be used as the microphone transducer. This is distinguished by a diaphragm that extends over a clearance in a body, for example a crystalline body.

The microphone transducer is preferably formed as a capacitor microphone in a silicon body, in which the diaphragm represents an electrode of the capacitor, the movement of which against a rigid rear electrode changes the capacitance of the capacitor microphone and thus provides a measured variable concerning the acoustic energy acting.

In the microphone according to the invention, a sound channel is geometrically defined by a sound guiding element and prefabricated as a component. The microphone according to the invention is therefore not dependent on possible interspaces between components of the microphone that are used in known solutions as a sound channel. This has the advantage that the sound channel can be designed freely and independently of boundary conditions of other processes and thus can be geometrically and acoustically optimized.

The sound guiding element sits on the base plate of the housing, but can be placed almost anywhere desired there. It is mechanically stably formed, can be mounted together with the components of the microphone and has a mechanically simple construction. The sound guiding element can therefore be produced from a wide variety of materials. For example, it is possible to produce it from metal. A metal sound guiding element has the advantage that it can be mounted together with the microphone transducer in an easy way by being soldered on.

A partition provided within the cavity is not part of the housing but is formed separately over the microphone components. The partition allows an increase in the size of the rear volume. The partition is able to separate the rear volume and the front volume in a soundproof manner. The sound channel in the sound guiding element connects an opening for the sound entry in the upper side of the housing to the active side of the microphone transducer. The sound guiding element is then preferably formed such that easy sealing off of the sound channel with respect to the rear volume can be performed by means of the partition.

In one embodiment, the partition between the front volume and the rear volume is formed as a film, which extends over at least the microphone transducer and the sound guiding element and lies around these components right up against the base plate and seals off the components with respect to the rear volume. Films that are known from the technology of packaging electrical components and MEMS components may be used. The film comprises for example a thermoplastic, which is thermally deformable. Also possible however is a film of which the plastic is in the B-stage, is thermally deformable and only after application goes over into a thermoset or a purely thermally no longer deformable state.

The rear volume is formed between the film used as a partition and the upper housing part. With the film, the microphone transducer and the sound channel are sealed off tight with respect to the base plate. In addition, the sound guiding element with the sound channel is made to finish right up against the covering in the region of the opening.

With the film, a simple partition is possible, which can be applied by standard methods in an easy and known way. The partition by the film can be used to form a rear volume that is defined solely by the size of the cavity, from which only the volume under the partitioning film has to be subtracted. It is not limited in practice by the geometrical dimensions of the microphone transducer or other components of the microphone.

The microphone transducer itself does not have to be sealed off with respect to the housing, is sealed off by the film used for the partition and, on account of the generally flexible film partition, is not exposed to any thermomechanical stress by the cavity housing. The sealing off of the opening in the cavity housing takes place solely with respect to the sound guiding element, which has a sufficiently mechanically stable construction and can be loaded with mechanical stress by the sealing without adversely influencing the properties of the microphone. The rear volume is therefore defined solely by the size of the cavity in the cavity housing.

In an advantageous refinement, the sound guiding element—possibly plus a covering layer and/or an adhesive layer located on it—has a greater height above the base plate than the microphone transducer, and thus after closing of the cavity housing can lie against the inner side of the covering while the upper side of the MEMS microphone transducer remains at a distance from the inner side of the covering.

The sound guiding element is clamped between the base plate and the covering such that the sound channel is sealed off with respect to the opening in the covering by the applied pressure alone.

The partitioning film, which of course extends over the sound guiding element, may provide better sealing between the sound guiding element and the covering. It is also possible to provide an additional sealing means, such as for example an adhesive, or an additional film between the partitioning film over the upper end of the sound guiding element and the housing. This additional sealing means may for example also be formed as a sealing ring. This may be prefabricated on the under side of the covering around the opening or fitted on the upper end of the sound guiding element around the mouth of the sound channel.

It is also possible however to seal off the sound guiding element subsequently, after the closing of the cavity housing, by specifically directed introduction of a sealing compound. For this purpose, it is possible to form the sound guiding element such that, after the closing of the cavity housing, between the sound guiding element and the covering there forms a capillary gap, which by the capillary forces allows reliable running of a sealing compound applied in a liquid state, for example a resin, and thus ensures complete sealing.

The microphone usually also has an integrated circuit, which for example is formed as an ASIC. This circuit controls the function of the microphone transducer and undertakes at least part of the signal processing of the electrical signals supplied by the microphone transducer. The integrated circuit is likewise mounted on the base plate and may optionally be arranged under the partition, that is to say within the front volume. It is also possible however to use the partition just to cover the microphone transducer and the sound guiding element and to arrange the integrated circuit alongside within the rear volume on the base plate.

The microphone transducer and the circuit are electrically connected to the base plate, which for this purpose has corresponding connection areas. The connection areas are connected to electrical external contacts on the underside of the base plate, by way of which the microphone can be fitted into an external switching environment, for example into an audio device or a cell phone. An electrical interconnection of the components may also be provided within the base plate.

The covering of the cavity housing is preferably formed as a cap, which is adhesively attached or soldered on the base plate and under which the cavity of the cavity housing is enclosed. The cap is preferably formed from metal or at least comprises a metal layer. This has the advantage that the microphone transducer and the integrated circuit are electromagnetically shielded with respect to the surroundings and ensure trouble-free operation of the microphone.

In one embodiment, the sound guiding element has at least an upwardly facing planar surface, in which the sound channel opens out. Furthermore, the sound guiding element has at least one side part, with which it sits on the base plate. The sound channel may be largely closed. It is also possible however to embody the sound guiding element with only one side wall, the opening of the sound channel pointing in the direction of the microphone transducer in order to allow optimum guidance of the sound toward the diaphragm on the underside of the microphone transducer. The sound channel may have an acoustically optimized shape and has a sufficiently large minimum cross section to avoid excessive acoustic attenuation.

The sound guiding element may be produced from metal, ceramic, metallized plastic or a printed circuit board material. The latter embodiment has the advantage that the material is compatible with the mounting process and can in an easy way be provided with solderable metallizations on the underside. In printed circuit board technology, there are also known methods in which geometrically structured three-dimensional bodies can be produced in low-cost processes.

The invention is explained in more detail below on the basis of exemplary embodiments and the associated figures. The figures serve merely for illustrating the invention and are therefore only schematic and not true to scale. Therefore, neither absolute nor relative dimensional indications can be inferred from the figures. Parts that are the same or act in the same way are provided with the same designations.

Figure 2:
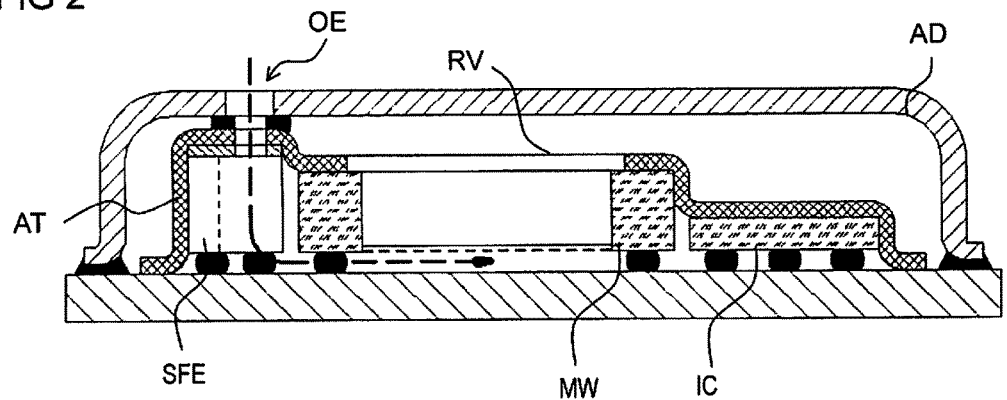
Figure 3:
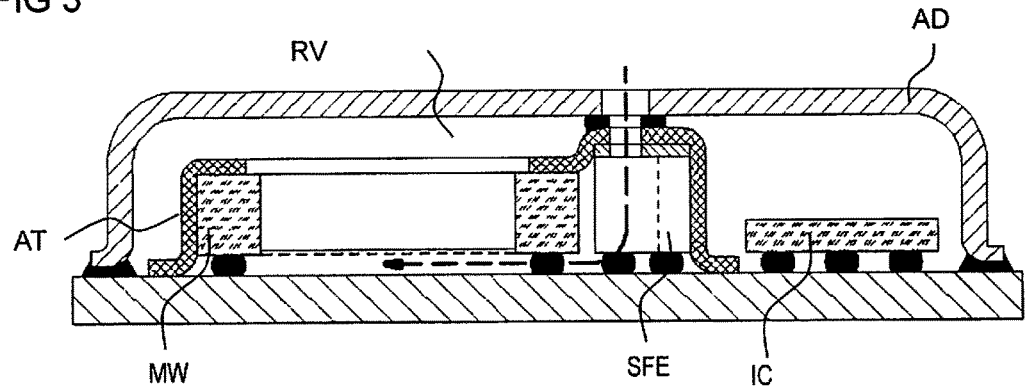
Figure 4:
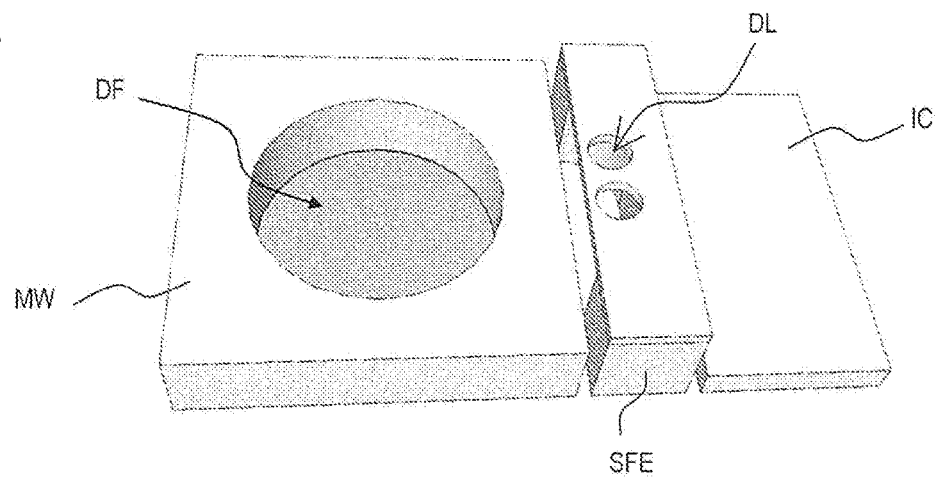
Figure 5:
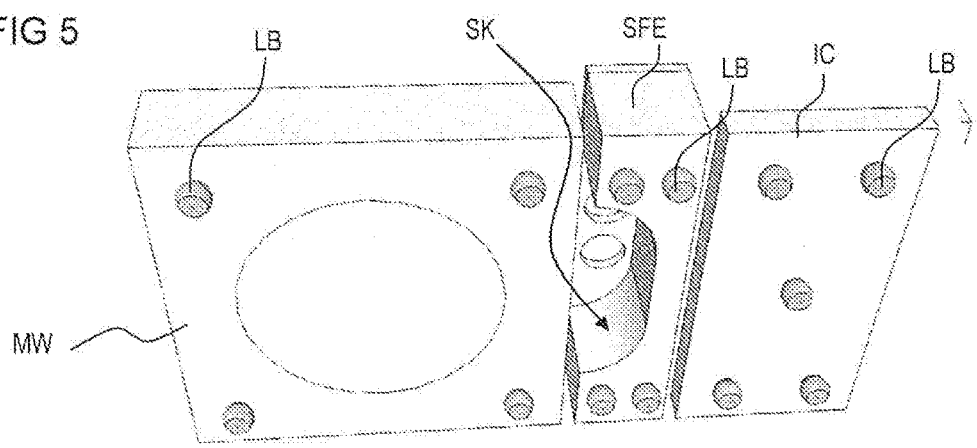
Figure 6:
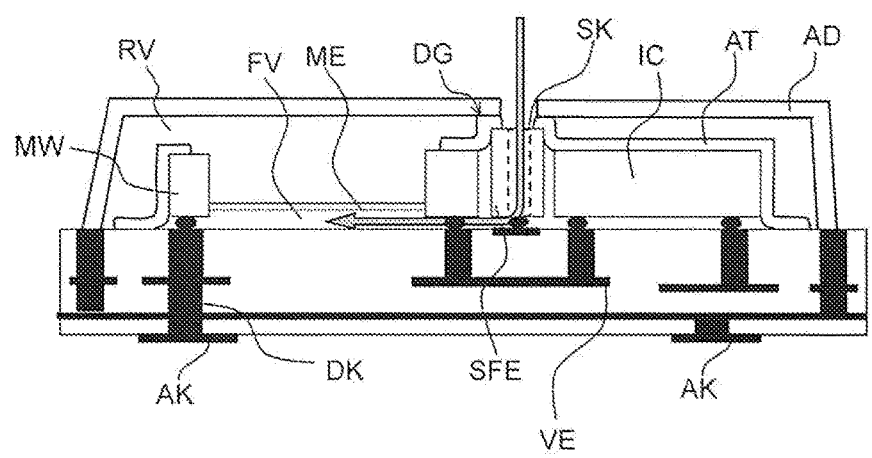

FIG. 1 shows a microphone according to the invention in schematic cross section according to a first exemplary embodiment, FIG. 2 shows a microphone in schematic cross section according to a second exemplary embodiment, FIG. 3 shows a microphone in schematic cross section according to a third exemplary embodiment, FIG. 4 shows a microphone transducer, a sound guiding element and an integrated circuit in a perspective representation obliquely from above, FIG. 5 shows the same arrangement in a perspective representation obliquely from below, FIG. 6 shows an exemplary embodiment in schematic cross section with a possible interconnection in the base plate.

FIG. 1 shows the first exemplary embodiment in schematic cross section through all of the components of the microphone. A cavity housing is formed by a base plate BP and a covering AD, which is in the form of a cap and is mounted on the upper side of the base plate with the aid of a fastening means BM. Hereinafter, terms such as up or down relate to the arrangement in the figure, but say nothing about the true spatial arrangement during use of the microphone or with respect to its alignment in a switching environment. The cap-shaped covering AD is for example adhesively attached or soldered on. In the latter case, metallized areas are correspondingly provided for this purpose on the base plate BP.

Mounted on the upper side of the base plate are a microphone transducer, for example a capacitor microphone formed as an MEMS component, a sound guiding element SFE and an integrated circuit IC, which is formed as a chip. The same technology is preferably used for mounting the three components, here for example a flip-chip arrangement over solder bumps LB. The microphone transducer MW is in this case mounted such that its diaphragm ME, and consequently also the electrical connections, face down. In the exemplary embodiment represented, the sound guiding element SFE is arranged between the microphone transducer MW and the integrated circuit IC. Preferably, but not necessarily, in this embodiment the sound guiding element SFE and the microphone transducer MW are arranged closely alongside one another.

The microphone transducer, the sound guiding element and the IC are sealed off with respect to the base plate BP by a laminating film, which serves as a partition AT between the front volume FV and the rear volume RV. The partition AT is applied after the mounting of the three components and is for example laminated on with the aid of pressure and increased temperature.

After producing the partition, for example by lamination, a lead-through DF is produced in the partitioning film AT above the diaphragm ME, so that the diaphragm is in connection with the rear volume RF directly under the covering AD.

The sound guiding element SFE is a mechanically stable part, which has a sound channel inside. The sound channel has at the top at least one passage DL for the sound entry and opens at the bottom in the direction of the microphone transducer MW. For this purpose, the sound channel does not have to be closed apart from the openings, but in the simplest case may also only consist of one or more side walls, which are open toward the microphone transducer MW. On the upper side, the sound guiding element SFE is formed flat and is provided with the passage mentioned.

The microphone transducer MW, the sound guiding element SFE and the integrated circuit IC are arranged at any desired distance from one another, which however is small enough that at least the partitioning film AT can extend over the remaining gaps between the sound guiding element SFE and the microphone transducer MW.

The sound guiding element SFE is dimensioned in its height above the base plate BP such that, after the closing of the cavity housing, it is firmly clamped between the covering and the base plate BP, possibly in interaction with the partitioning film, a top layer and possibly a sealing means, such as for example an adhesive layer, on the upper side of the sound guiding element. The microphone transducer has a smaller height, and therefore is not exposed to any mechanical loading by the housing. Provided in the covering AD is an opening OE for the sound entry, which is in line with the passage DL on the upper side of the sound guiding element SFE.

The sound channel is sealed off with respect to the rear volume RV. On account of the sound guiding element lying against the covering AD, the sealing may take place by the partitioning film AT, lying right up against the covering AD, or possibly additionally by a sealing means DM, for example a sealing ring.

In this way, the inside of the cavity housing is separated into a front volume FV and a rear volume RV. The sound channel inside the sound guiding element SFE, the interspaces between the microphone transducer, the sound guiding element and the integrated circuit IC and also under the components between the solder bumps may be counted as included in the front volume FV. The rear volume RV extends between the covering AD and the partitioning film AT. The cavity volume preformed within the microphone transducer MW, over its diaphragm, is connected by way of the lead-through DF to the remaining rear volume RV and is therefore counted as included in it.

The opening OE in the covering AD, the passage DL in the upper side of the sound guiding element FE and the sound channel SK may have the same cross section, and are arranged one over the other such that a continuous sound channel is obtained.

In the production of the microphone it is possible to leave the partitioning film AT above the mouth of the sound channel at the sound guiding element SFE and only to produce the opening for the sound entry, for example by means of drilling, lasering or etching, after placing on the covering D. In this case it is also possible to produce the opening OE in the covering AD and possibly corresponding openings in the top layer and sealing means together with the passage DL, for example by laser drilling.

The exact sound guidance, that is to say the path of an acoustic signal from outside the microphone through the opening OE to under the diaphragm of the microphone transducer MW, is identified in the figure by a dashed line with an arrow. If the sound guiding element SFE has a sufficiently high acoustic cross section, no attenuation of the acoustic signal should be expected in spite of sound diversion, so that the full functionality of the microphone is ensured. Because the rear volume RV is increased according to the invention by the entire space under the covering AD, the microphone has a high sensitivity together with a high signal-to-noise ratio.

The invention allows the sound guiding element SFE to be arranged independently of the arrangement of the integrated circuit IC within the cavity housing, but preferably directly alongside the microphone transducer MW. FIG. 2 shows an arrangement in which the microphone transducer MW is arranged between the integrated circuit IC and the sound guiding element SFE. Here, too, the laminate film used as the partition AT covers over the three components mounted in the same way, the sound guiding element SFE, the microphone transducer MW and the integrated circuit IC, and seals them off with respect to the base plate BP.

A third embodiment is represented in FIG. 3. Here, the integrated circuit IC is mounted on the base plate completely independently of the microphone transducer and the sound guiding element. This may be performed after applying the laminate film used as the partition AT, if the film is then removed again locally at the mounting location of the integrated circuit IC. It is also possible only to draw the laminate film used as the partition AT over the microphone transducer MW and the sound guiding element SFE and seal it off with the surface of the base plate BP around these two components. The integrated circuit IC remains free from the partition AT. It is also possible to remove the partition AT over the integrated circuit IC again.

As the three embodiments represented show, it is possible with the invention to move the sound entry opening OE through the covering AD around over a wide range within the cavity housing, and consequently to choose it practically without restriction. All that is necessary here is to ensure the spatial proximity to the microphone transducer MW, which restricts the possible positions a little.

FIG. 4 shows a possible geometrical configuration of a sound guiding element SFE on the basis of a perspective representation, which represents a view obliquely from above of the arrangements comprising the microphone transducer MW, the sound guiding element SFE and the integrated circuit IC. The microphone transducer MW comprises a crystalline body, of which the clearance with the lead-through DF that is formed inside above the diaphragm ME is represented.

To the right of the microphone transducer MW, the sound guiding element SFE is formed as a molded part, which at the top is formed with a flat surface with at least one passage, in the figure for example two passages DL. The sound guiding element SFE has at least two side parts, with which it is mounted on the base plate BP. In the exemplary embodiment represented, the sound guiding element SFE has a round, oval or otherwise shaped sound channel SK, which is open in the direction of the microphone transducer MW.

FIG. 5 shows in a perspective view obliquely from below the exact shaping of the sound channel, which under the planar upper side is only bounded by the semicircularly curved side part in the direction facing away from the microphone transducer MW, in which in the arrangement shown the integrated circuit IC is arranged. The arrangement of the integrated circuit IC may however also take place at any other desired location and only by way of example is to the right of the sound guiding element SFE here.

FIG. 5 also shows the solder bumps LB, which are arranged on the underside of the microphone transducer, the sound guiding element and the integrated circuit or the chip with the integrated circuit and serve both for the mechanical fastening and the electrical contacting of the microphone transducer MW and the integrated circuit IC. The sound guiding element SFE does not need any electrical connection, but, as long as it is produced from metallic material, can be connected to ground potential.

Apart from the shaping of the sound guiding element SFE that is shown, any other desired configurations are possible, in which the sound channel may also be closed in a tubular form and merely has an opening at the lower end in the direction of the diaphragm. A single passage DL or else a multiplicity of cross-sectionally smaller passages DL may be arranged on the upper side of the sound guiding element. In this way it is possible on the one hand to protect the sound channel from the ingress of dirt particles and on the other hand to set the acoustic impedance already at this location.

FIG. 6 shows on the basis of a schematic cross section through a microphone according to the invention an only schematically represented integrated interconnection within the base plate BP. The connection areas of the base plate BP, in which the microphone transducer MW and the integrated circuit IC are soldered on, are connected by way of via holes to at least one interconnection level VE inside the base plate BP. Further via holes DK connect the interconnection level VE to external contacts AK on the underside of the base plate BP. In addition, the figure shows how the covering AD, for example a metal cap, can be electrically connected likewise with the aid of a via hole, and for example connected to ground potential, in order to allow better electromagnetic shielding of the microphone.

It is found overall that, with the use of the sound guiding element, the housing design can be made very flexible. Thus, for example, if an altered height of the cavity housing, for example the height of the covering cap AD, is specified, it is not necessary to interfere with the complex production process of the microphone transducer, that is to say the MEMS component. Instead, merely the simple and low-cost sound guiding element is adapted.

With the sound guiding element, and optionally an additional sealing means DM, which may be a further covering film or an adhesive and/or a top layer, allowance can also easily be made for height tolerances without having to modify costly deep-drawing tools for a metal covering AD. The opening for the sound entry can also be relocated without any problem, without causing high tool costs for modified injection-molded housings.

It is also advantageous that mechanical and thermomechanical stress between the covering and the base plate does not act on the sensitive MEMS chip, but is absorbed by the sound guiding element, which is robust and not relevant to reliability.

For greater mechanical stability, the sound guiding element preferably has at least one transverse web or a side wall, which stiffens it against such loads. With a suitable choice of material and suitable shaping, the sound guiding element may also be formed in the shape of a bridge arch. A cuboid with one or more communicating boreholes is also possible for the sound channel.

A stamping process may be used with particularly low cost for the production of the sound guiding channel, which is preferably led in a straight line through the sound guiding element.

An advantageous cross section of the acoustic channel under the sound entry opening OE to the lower edge of the microphone transducer preferably does not lie below 0.02 $mm^2$, for example is at 0.04 $mm^2$ and is advantageously at a cross section of 0.08 $mm^2$ and more.

Various materials and methods are suitable for the production of the sound guiding element. It is possible for example to produce the sound guiding element as a plastic injection-molded part, possibly with a plastic containing metal particles. 3D printing and production as a sintered part are also possible. A structured silicon chip, in which the corresponding sound channel and the passage are etched, may also be used as a sound guiding element. In order to save on metallizations for soldering on a sound guiding element that does not consist of metal, the sound guiding element may also be adhesively attached on the base plate.

It is preferred to use for the sound guiding element SFE a single-layer or multi-layer panel comprising a ceramic HTCC or LTCC or organic laminate sheet, with which all of the required details can be produced in large-format multiple panels at low cost by large-area processes. In the panel, thousands of such elements can be processed in parallel and subsequently singulated.

The invention is not restricted to the few embodiments that are represented in the figures. Rather, it is clear that the exact configuration of the cavity housing as described at the beginning is not restricted to a combination of a flat base plate and a covering in the form of a cap, but instead may also be constructed as a well-shaped base plate and a flat covering formed as a cover. Accordingly, sub-combinations of the details represented in the individual embodiments may be regarded as further configurations according to the invention, which are not however separately described in this combination.

LIST OF TERMS AND DESIGNATIONS

Cavity housing having
BP base plate,
AD covering (cap or cover) with
OE opening for sound entry
MW microphone transducer with
ME diaphragm
SFE sound guiding element with
SK sound channel
AT partition, for example a film, separates
FV front volume and
RV rear volume
DF lead-through (in film over diaphragm)
DM sealing means (between sound guiding element and covering)
IC circuit
DL passage on upper side of the sound guiding element
AK external contacts
DG sealing
LB solder bumps
VE interconnection level
DK via hole
BM fastening means

The invention claimed is:

1. A microphone
having a closed cavity housing, which has a base plate, a covering and an opening therein for the sound entry;
having a microphone transducer, formed as an MEMS component, and a sound guiding element with a sound channel formed therein, the two of which are arranged alongside one another on the base plate within the cavity housing, and
having a partition, which divides the inside of the cavity housing into a front volume and a rear volume,
in which the sound channel connects the opening to the front volume and is closed off in a soundproof manner with respect to the rear volume,
in which the partition is formed as a film, which extends over at least the microphone transducer and the sound guiding element and is sealed off with respect to the base plate,
in which a lead-through, which connects the rear volume within the cavity housing to a volume preformed in the MEMS microphone transducer above a diaphragm, is left free in the film above the microphone transducer, and
in which the sound guiding element with the sound channel finishes right up against the covering around the opening.

2. The microphone according to claim 1,
in which the sound guiding element has a greater height above the base plate than the microphone transducer, and thus after closing of the cavity housing can lie against the inner side of the covering while the upper side of the MEMS microphone transducer remains at a distance from the inner side of the covering.

3. The microphone according to claim 1,
in which the sound guiding element is mounted together with the microphone transducer on the base plate by the same technology and
in which the film serves for the sealing between the sound guiding element and the covering.

4. The microphone according to claim 1,
in which on the base plate there is also mounted an integrated circuit, which is arranged under the partition and therefore within the front volume, or in the rear volume.

5. The microphone according to claim 1,
in which the covering is formed as a cap, which is adhesively attached or soldered on the base plate and under which the cavity of the cavity housing is enclosed.

6. The microphone according to claim 5,
in which the cap consists of metal or at least comprises a metal layer.

7. The microphone according to claim 1,
in which the sound guiding element has at least an upwardly facing planar surface with a passage for the sound channel and a side part, with which it sits on the base plate.

8. The microphone according to claim 1,
in which the sound guiding element is produced from metal, ceramic or a printed circuit board material.

9. The microphone according to claim 4,
in which the base plate has connection areas for the microphone transducer and the integrated circuit, and
in which the connection areas are connected in an electrically conducting manner to external contacts on the underside of the base plate.

10. A method for producing a microphone having an increased rear volume,
in which a microphone transducer and a sound guiding element with a sound channel are mounted closely alongside one another on a base plate of a cavity housing,
in which the microphone transducer and the sound guiding element are covered over with a film, which is sealed off with respect to the base plate,
in which a lead-through through the film over the microphone transducer and a passage through the film at the upper mouth of the sound channel on the upper side of the sound guiding element are provided,
in which the cavity housing is closed by placing a covering onto the base plate,
wherein the sound guiding element supports the covering over the base plate,
wherein, after being placed on, an opening in the covering finishes with the upper mouth of the sound channel and the lower opening of the sound channel is connected to a front volume under the film,
wherein a diaphragm on the underside of the microphone transducer is coupled to the front volume, wherein the front volume is separated by the film from the rear volume enclosed between the covering and the film.

11. The microphone according to claim 1, in which the sound guiding element has a greater height above the base plate than the microphone transducer, and thus after closing of the cavity housing can lie against the inner side of the covering while the upper side of the MEMS microphone transducer remains at a distance from the inner side of the covering.

12. The microphone according to claim 1, in which the sound guiding element is mounted together with the microphone transducer on the base plate by the same technology and in which the film serves for the sealing between the sound guiding element and the covering.

13. The microphone according to claim 1, in which on the base plate there is also mounted an integrated circuit, which is arranged under the partition and therefore within the front volume, or in the rear volume.

14. The microphone according to claim 2, in which on the base plate there is also mounted an integrated circuit, which is arranged under the partition and therefore within the front volume, or in the rear volume.

15. The microphone according to claim 3, in which on the base plate there is also mounted an integrated circuit, which is arranged under the partition and therefore within the front volume, or in the rear volume.

16. The microphone according to claim 1, in which the covering is formed as a cap, which is adhesively attached or soldered on the base plate and under which the cavity of the cavity housing is enclosed.

17. The microphone according to claim 2, in which the covering is formed as a cap, which is adhesively attached or soldered on the base plate and under which the cavity of the cavity housing is enclosed.

18. The microphone according to claim 5, in which the base plate has connection areas for the microphone transducer and the integrated circuit, and in which the connection areas are connected in an electrically conducting manner to external contacts on the underside of the base plate.

19. The microphone according to claim 7, in which the base plate has connection areas for the microphone transducer and the integrated circuit, and in which the connection areas are connected in an electrically conducting manner to external contacts on the underside of the base plate.

20. A microphone
having a closed cavity housing, which has a base plate, a covering and an opening therein for the sound entry,
having a microphone transducer, formed as an MEMS component, and a sound guiding element with a sound channel formed therein, the two of which are arranged alongside one another on the base plate within the cavity housing,
having a partition, which divides the inside of the cavity housing into a front volume and a rear volume,
in which the sound channel connects the opening to the front volume and is closed off in a soundproof manner with respect to the rear volume,
in which the covering is formed as a cap, which is adhesively attached or soldered on the base plate and under which the cavity of the cavity housing is enclosed,
in which the partition is formed as a film, which extends over at least the microphone transducer and the sound guiding element and is sealed off with respect to the base plate,
in which a lead-through, which connects the rear volume within the cavity housing to a volume preformed in the MEMS microphone transducer above a diaphragm, is left free in the film above the microphone transducer, and
in which the sound guiding element with the sound channel finishes right up against the covering around the opening.

* * * * *